(12) United States Patent
Chen et al.

(10) Patent No.: US 7,420,846 B2
(45) Date of Patent: Sep. 2, 2008

(54) READ AND ERASE VERIFY METHODS AND CIRCUITS SUITABLE FOR LOW VOLTAGE NON-VOLATILE MEMORIES

(75) Inventors: Jian Chen, San Jose, CA (US); Khandker N. Quader, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 10/552,948

(22) PCT Filed: Apr. 8, 2004

(86) PCT No.: PCT/US2004/010991

§ 371 (c)(1), (2), (4) Date: Sep. 11, 2006

(87) PCT Pub. No.: WO2004/093090

PCT Pub. Date: Oct. 28, 2004

(65) Prior Publication Data

US 2007/0058435 A1  Mar. 15, 2007

(51) Int. Cl.
*G11C 16/06* (2006.01)
(52) U.S. Cl. ............ 365/185.22; 365/185.21; 365/185.2; 365/211
(58) Field of Classification Search ............ 365/185.22, 365/185.21, 185.2, 211
See application file for complete search history.

(56) References Cited

U.S. PATENT DOCUMENTS

| | | | |
|---|---|---|---|
| 5,521,865 A | 5/1996 | Ohuchi et al. |
| 5,570,315 A | 10/1996 | Tanaka et al. |
| 5,652,719 A | 7/1997 | Tanaka et al. |
| 5,694,356 A | 12/1997 | Wong et al. |
| 5,870,334 A | 2/1999 | Hemink et al. |
| 5,949,714 A | 9/1999 | Hemink et al. |
| 5,969,985 A | 10/1999 | Tanaka et al. |
| 6,044,013 A | 3/2000 | Tanaka et al. |
| 6,046,935 A | 4/2000 | Takeuchi et al. |
| 6,088,559 A | 7/2000 | Costanza et al. |
| 6,134,140 A | 10/2000 | Tanaka et al. |
| 6,208,560 B1 | 3/2001 | Tanaka et al. |
| 6,282,117 B1 | 8/2001 | Tanaka et al. |
| 6,363,010 B2 | 3/2002 | Tanaka et al. |

(Continued)

OTHER PUBLICATIONS

International Search Report mailed Aug. 16, 2004.

(Continued)

*Primary Examiner*—Connie C Yoha
(74) *Attorney, Agent, or Firm*—Davis Wright Tremaine LLP

(57) ABSTRACT

In a non-volatile memory, the read parameter used to distinguish the data states characterized by a negative threshold voltage from the data states characterized by a positive threshold voltage is compensated for the memory's operating conditions, rather than being hardwired to ground. In an exemplary embodiment, the read parameter for the data state with the lowest threshold value above ground is temperature compensated to reflect the shifts of the storage element populations on either side of the read parameter. According to another aspect, an erase process is presented that can take advantage the operating condition compensated sensing parameter. As the sensing parameter is no longer fixed at a value corresponding to 0 volts, instead shifting according to operating conditions, a sufficient margin is provided for the various erase verify levels even at lowered operating voltages.

14 Claims, 3 Drawing Sheets

U.S. PATENT DOCUMENTS

| | | |
|---|---|---|
| 6,373,746 B1 | 4/2002 | Takeuchi et al. |
| 6,434,055 B2 | 8/2002 | Tanaka et al. |
| 6,542,407 B1 | 4/2003 | Chen et al. |
| 6,545,909 B2 | 4/2003 | Tanaka et al. |
| 6,549,464 B2 | 4/2003 | Tanaka et al. |
| 6,560,152 B1 | 5/2003 | Cernea |
| 6,798,698 B2 | 9/2004 | Tanaka et al. |
| 7,057,969 B2 * | 6/2006 | Chow et al. .................. 365/233 |
| 7,139,465 B2 * | 11/2006 | Gongwer et al. ....... 365/185.12 |
| 7,190,622 B2 * | 3/2007 | Roohparvar ........... 365/185.22 |
| 2002/0101778 A1 | 8/2002 | Khan |
| 2005/0013169 A1 | 1/2005 | Tanaka et al. |

OTHER PUBLICATIONS

EPO, "Office Action," mailed in related European Application No. 04 759 345.4 on Jul. 2, 2007, 3 pages.

Notification of Transmittal of the International Search Report and the Written Opinion of the International Searching Authority, or the Declaration for International Application No. PCT/US2004/010991 dated Aug. 16, 2004, 11 pages.

* cited by examiner

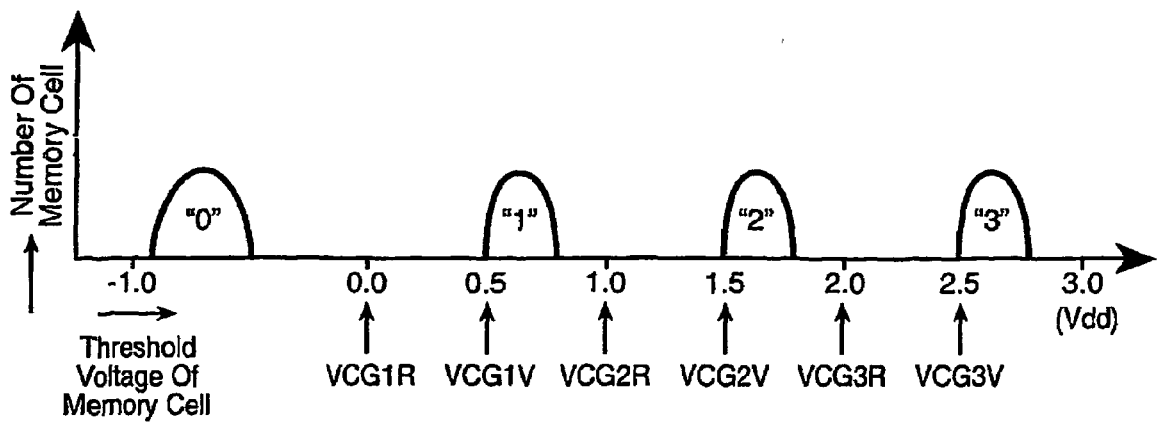
FIG._1
*(PRIOR ART)*
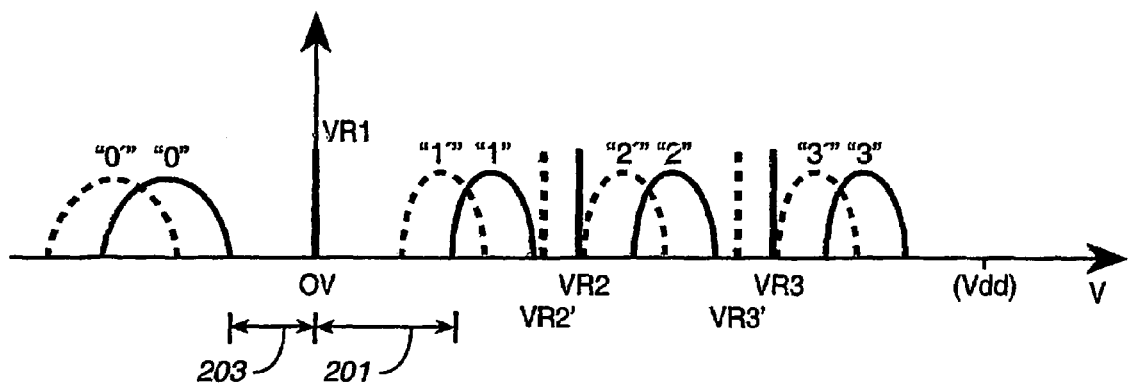
FIG._2
*(PRIOR ART)*
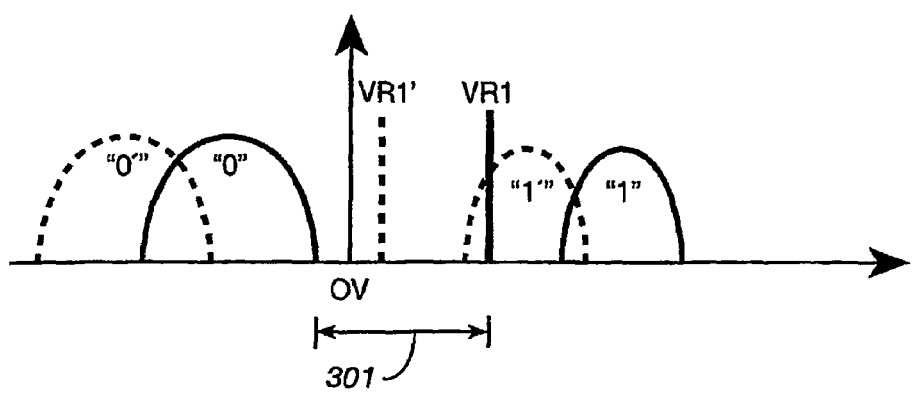
FIG._3

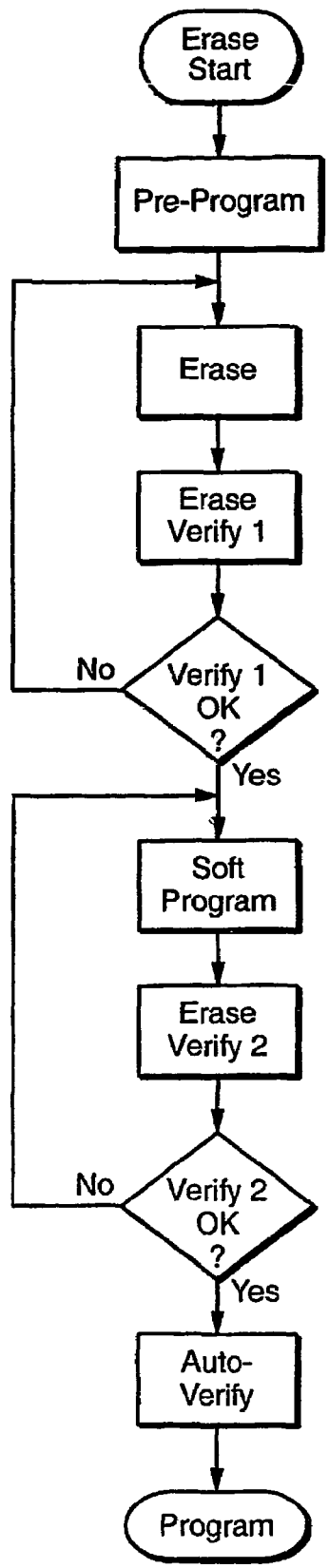
FIG._4

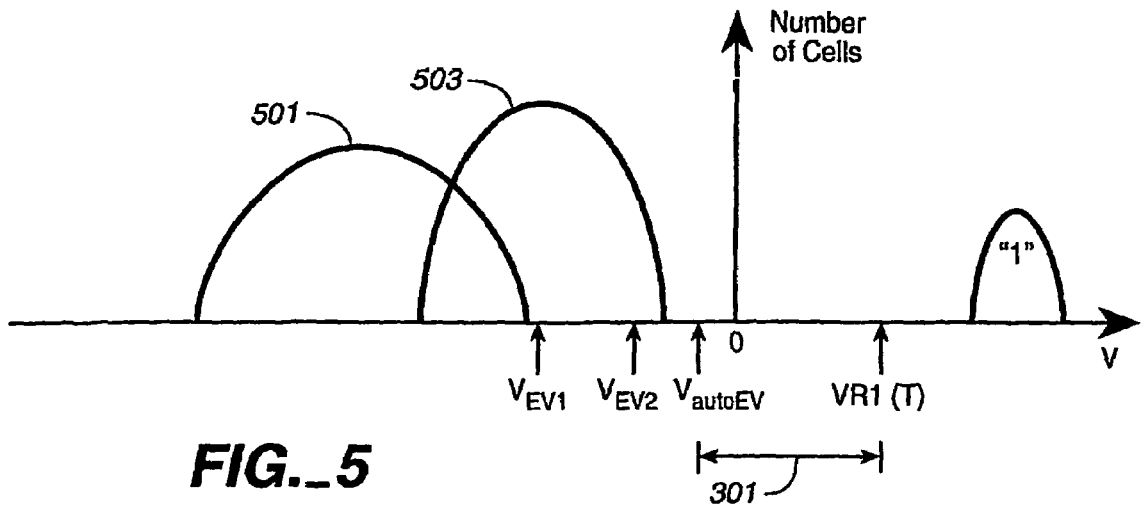
FIG._5
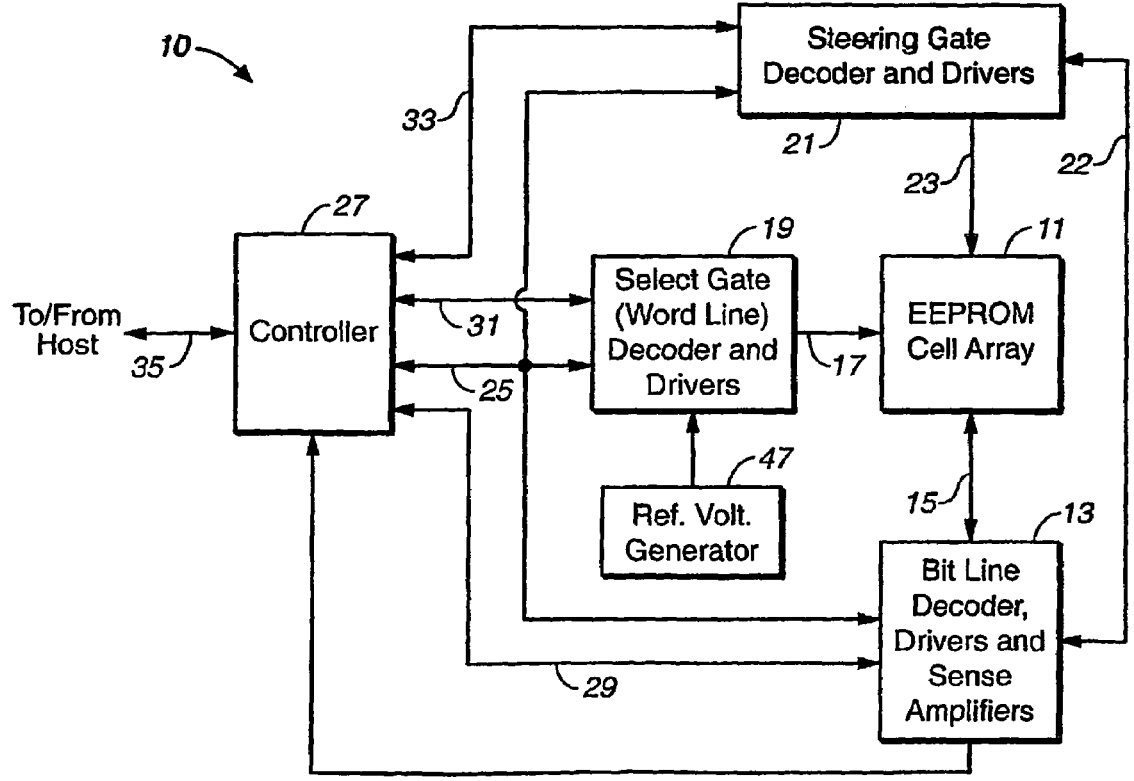
FIG._6

READ AND ERASE VERIFY METHODS AND CIRCUITS SUITABLE FOR LOW VOLTAGE NON-VOLATILE MEMORIES

CROSS-REFERENCE TO RELATED APPLICATIONS

This application is a national stage entry of application Ser. No. PCT/US2004/010991 filed on Apr. 8, 2004, which claims priority of U.S. application Ser. No. 10/414,132 filed on Apr. 14, 2003, both of which are hereby incorporated by reference

FIELD OF THE INVENTION

This invention relates generally to non-volatile memories and their operation, and, more specifically, to techniques.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, and Ser. No. 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in U.S. Pat. No. 6,046,935 and U.S. patent application Serial No. 09/893,277, filed Jun. 27, 2001, that are also hereby in incorporated by reference, and references contained therein.

In non-volatile semiconductor memories, such as an EEPROM or Flash memory, the amount of data stored per memory cell has been increased in order to increase storage densities. At the same time, the operating voltages of such devices have decreased to reduce power consumption. This results in a greater number states stored in a smaller range of voltage or current values. As the voltage or current separation between data states decreases, the accurate placement of the breakpoints used to distinguish between data states becomes more critical. Another complicating factor is that the parameter, such as threshold voltage, representing the data state of the storage element populations can vary with operating conditions. Consequently, in order to maintain the reliability of memory operation in light of the conflicting demands of increasing the number of states per cell and decreasing operating voltages, improvements to memory design become ever more important.

FIG. 1 shows a distribution of threshold voltages for a collection of storage elements programmed into one of four data states for a system designed for 3 volt operations, such as described in U.S. Pat. No. 6,046,935 and U.S. patent application Ser. No. 09/893,277, both incorporated above. The programming process has grouped the memory cells into four populations, labeled as "0", "1", "2", and "3". The "0" state is characterized by a negative threshold voltage, $V_{th}<0V$, with the other states characterized by having threshold voltages above ground. Typically, the following an erase and pre-programming phase, the memory elements are programmed to their respective data states based upon the verify voltages of VCG1V for the "1" state, VCG2V for the "2" state, and VCG3V for the "3" state. The result is the four cell population distributions represented by the lumps in FIG. 1.

During a read process, the data states are distinguished from each other by the breakpoints: VCR3R distinguishes the "3" state from the "2", VCR2R distinguishes the "2" state from the "1", and VCR1R distinguishes the "1" state from the "0". Although the states are defined by their threshold voltages in the exemplary embodiment of a FLASH memory, another parameter, such as current or frequency, may be sensed in a read or verify operation. More detail on read, write, and verify operations are given in the various references incorporated above and in U.S. patent application Ser. No. 10/052,924, filed on Jan. 18, 2002, that is also hereby incorporated by reference, and references contained therein.

To maintain the integrity of both the read and the write process, both the population distributions of cells in the different states and the read points for distinguishing these points need to be well defined. The population distributions can shift over time or as operating conditions (temperature, power supply level, device age, etc.) change. Although the four-state, 3.0V design (corresponding to Vdd=2.6V) may provide a sufficient safety margin in which to place the read points between the state populations, these tolerances can become very tight as systems move to more states, lower operating voltages, or both.

SUMMARY OF THE INVENTION

According to a primary aspect of the present invention, a non-volatile memory wherein the sensing process compensates for the variations of all of the populations of the memory cells due to operating conditions. The read parameter used to distinguish the data states characterized by a negative threshold voltage from the data states characterized by a positive threshold voltage is compensated for the memory's operating conditions, rather than being hardwired to ground. This allows for a more efficient budgeting of the available voltage widow, which is particularly important in multi-state memories designed for low voltages operation. The compensation for operating conditions can also be applied to the program verify parameter for the lowest, non-negative threshold state. In an exemplary embodiment, the read parameter for the data state with the lowest threshold value above ground is temperature compensated to reflect the shifts of the storage element populations on either side of the read parameter.

According to another aspect of the present invention, an erase process is presented that can take advantage the operating condition compensated sensing parameter. As the sensing parameter is no longer fixed at a value corresponding to 0 volts, instead shifting according to operating conditions, a sufficient margin is provided for the various erase verify levels even at lowered operating voltages.

In an exemplary embodiment, a 1.8 volt design uses a temperature compensated read parameter to distinguish between a negative threshold data state and the lowest of the positive threshold states. This is achieved by producing a temperature compensated control gate voltage in a range of 0-0.2 voltage provided, in one embodiment, by a negative voltage source connected to a band gap generator. This provides move overhead in which to use a number of verify levels associated with as erase and soft-programming process.

Additional aspects, features and advantages of the present invention are included in the following description of exemplary embodiments, which description should be taken in conjunction with the accompanying drawings.

BRIEF DESCRIPTION OF THE DRAWINGS

FIG. 1 shows a distribution of threshold voltages for a collection of storage elements programmed into one of four data states for a system designed for 3-volt operations.

FIG. 2 illustrates the effect of operating conditions on a memory system.

FIG. 3 shows the use an operating condition compensated read voltage for distinguishing between states characterized by negative and positive voltages.

FIG. 4 is a flowchart for an exemplary embodiment of a preprogramming erase process.

FIG. 5 shows an arrangement of various erase verify levels in an exemplary embodiment.

FIG. 6 is a block diagram of a memory system incorporating aspects of the present invention.

DESCRIPTION OF EXEMPLARY EMBODIMENTS

For specificity, the present invention will be described mainly in terms of a 4-state, 1.8V (Vdd=1.5V) design with a first state characterized by a negative $V_{th}$ value and one or more (here 3) states characterized by a $V_{th}>0V$. More generally, there will be one or more states characterized by a negative threshold and be one or more states characterized by a positive threshold. When reference to a specific memory system is needed, the exemplary embodiment is a flash memory composed of units having one or more floating gates and usually one or more select gates; for example, a memory of the NAND type that is composed of strings of floating gate transistors connected in series with a select gate on either end. Various applicable memory structures are described in the reference incorporated into the Background section.

FIG. 2 illustrates the effect of operating conditions on a memory system. This figure again shows three state populations ("1", "2", "3") characterized by a positive threshold value and one population ("0") characterized by a negative threshold value. The solid lines ("0", "1", "2", "3") represent the distribution of the cells as initial programmed for the four states based on verify levels determined by reference cells, a band-gap device, or other techniques. The dotted lines ("0'", "1'", "2'", "3'") represent the distributions shifted due to a change in operating conditions. Examples of such changes in operating conditions are power supply variations, device aging, temperature variations, and so on. For specificity, the temperature variation case is mainly discussed here; for example, in a particular variety of flash memory cells, it is found that the populations shift by something on the order of 0.25V over the temperature range of −40° C. to +100° C., or about 1.8 mV/° C. If the temperature range is a less extreme −10° C. to +85° C., this is still a shift of 0.17V. The spread of the three positive threshold populations, sufficient room between the populations to be able to distinguish the distributions, and additional room to allow for the population shifts due to operating conditions all need to fit between 0V and Vdd=1.5. Allowing up to a quarter volt of population shift for each population significantly cuts into the voltage window. (A possible alternative involves the use of charge pumps to increase the size of the voltage window relative to the power supply level, but this is often too expensive to be practical.)

The space available is also squeezed from below 0V as the operating voltages are decreased. To use of a lower Vdd value to use less energy usually leads to a less negative voltage for the distribution of storage elements subsequent to an erase process. This leaves less room for any soft programming or other verify levels discussed below to fit in below the 0V level that distinguishes the "0" state from the "1" state.

The read point used to distinguish between the "2" and "3" state is shown as VR3 and the read point used to distinguish between the "1" and "2" state is shown as VR2. When the population distributions shift, they become too close to the read points to maintain a sufficient margin to safely read the data within the restricted space in the of the threshold windows. Consequently, techniques have been introduced to vary the read points to VR2' and VR3' according to operating conditions. (Although this is discussed in terms of voltages, the actual quantity used in the sensing process may be current or another parameter, as noted in the Background.) For example, for the sort of temperature variation described above, if the $V_{read}$ and $V_{verify}$ levels vary as $V_{read}/V_{verify} \sim V_{T=0} + (1.8 \text{ mV}/°\text{C.}) \text{T}(°\text{C.})$, where $V_{T=0}$ is the read/verify value at 0° C., the sense point will be shifted along with the population distributions. This frees up much of the amount of the population shift to be used for population spread and read margin. The use of reference or tracking cells, such as described in U.S. Pat. No. 5,172,338 or U.S. patent application Ser. No. 09/671,793 filed Sep. 27, 2000, which are both hereby incorporated by reference, is, one method for handling this problem. Other techniques for compensation due to operating conditions are described in U.S. patent application Ser. No. 10/053,171 filed Nov. 2, 2002, and U.S. Pat. No. 5,694,356, both hereby incorporated by reference.

The prior art distinguishes the "0" state, characterized by a negative threshold voltage, from the "1" state, characterized by a positive threshold voltage, by use a read point VR1 hardwired to ground. The use of VR1=0V is particularly easy to implement and clearly distinguishes between the highest of any negative threshold voltage states and the lowest of any positive threshold states; for example, the system can just set the control gate to ground and see if any current flows. Consequently, in the prior art VR1' is the same as VR1 since VR1 is not a function of temperature, VR1'=VR1≠f(T). Additionally, temperature compensation is harder around V=0, whether for VR1 or another parameter. However, this results requiring a relatively large gap 201 between the lower end of the "1" state population (as determined by the verify level for this state when first programmed) and V=0, further squeezing the available space.

A major aspect of the present invention is to introduce compensation for operating conditions for the breakpoint that distinguishes the negative threshold states from the positive threshold states, rather than just a hardwired value of 0V. Thus, in the temperature example, the fixed, hardwired VR1=0V read point is replaced by a temperature compensated value, VR1=f(T), more fully using the available voltage window. This can be used to add more states, make the memory more robust, relax margins elsewhere, or some combination of these as selected by the designer. As described further below, this also allows more space for the various negative voltage values.

FIG. 3 illustrates the use of a condition compensated breakpoint for distinguishing a $V_{th}<0V$ state from a $V_{th}>0V$ state, where, for simplicity, only a single negative threshold state ("0") and a single positive threshold state ("1") are shown. As before; the dotted lines ("0'", "1'", "2'", "3'") represent the distributions shifted due to a change in operating conditions from the solid distributions ("0", "1"). In contrast to the prior art, whereas the read level VR1 would correspond to the 0V axis the present invention introduces a read value VR1 corresponding to the operating conditions of the solid distributions that is offset to a positive voltage value that shifts along with the distributions, such as VR1' corresponding to the conditions of the distributions with the dotted lines. For example, the temperature dependence of VR1 can be designed to track that of the storage elements.

Compensation for operating conditions can also be applied to the verify level for the "1" state, $V_{ver1}$. This may be the same level as used for the read operation or offset by a margin above the read value, as is described in many of the references incorporated above; see, for example, U.S. Pat. No. 5,418,752. Thus, $V_{ver1}$ may also be function of operation conditions, where a $V_{ver}1$ would correspond to the operating conditions for the "0" and "1" population distributions and a $V_{ver}1'$ would correspond to the conditions for the "0'" and "1'" distributions.

The use of a sensing parameter compensated for operating conditions for use between the positive threshold states and the negative threshold states frees up more room in the available voltage window. Whereas in the fixed, VR1=0V embodiment shown in FIG. 2 the gap 201 between the "1" states and 0V always had to be large enough so that the "1" states were above 0V with sufficient margin and, independently, the gap 203 between the "0" states and 0V always had to be large enough so that the "0" states were below 0V with sufficient margin, according to the invention as illustrated in FIG. 3, it is only necessary the total gap 301 between the "0" and "1" distribution is large enough to be able to distinguish elements of the two populations with sufficient fidelity. This extra usable space in the voltage window can also be used to provide sufficient space to fit in the various erase verify levels associated establishing the $V_{th}<0V$ populations that are described below with respect to FIG. 4.

Although the discussion here is being presented in terms of voltages, such as VR1, being used as the sensing parameter (whether during a read or during a verify) since voltage is what distinguishes the "0" states from the "1" states, other parameters such as current or frequency may also be used, as described more fully is U.S. patent application Ser. No. 10/052,888 filed Jan. 18, 2002, which is hereby incorporated by reference.

FIG. 4 is a flow chart of an exemplary embodiment of an erase and program operation that illustrates some of levels that may be used in preparing the "0" or ground state in the storage elements, both for when this is the target value of a storage element and also as a possible starting point for programming a storage unit into the data states characterized by a positive threshold voltage. This process starts at step 401.

Step 401 pre-programs the storage units. This serves the dual purpose of having the storage units start the actual erase 405 at a more uniform state and also helps to even wear so that the cells age more uniformly. For example, in a NAND architecture, such as that described in U.S. Pat. No. 6,046,935 and U.S. patent application Ser. No. 09/893,277 incorporated above, this can be implemented by taking all of the wordlines in the erase unit high for a single pulse of, say, 10 µs. Other architectures or cell types would use the appropriate programming technique when this step is included.

The actual erase takes place in step 405. This will again be as appropriate for the storage element and architecture. For the exemplary NAND flash EEPROM, this can be the application of the erase voltage to the memory's well structure, such as an application of 18V for around 1 ms. The success of the erase operation can be checked in an erase verify operation, step 407. This checks whether all of the erased storage elements have a threshold voltage below a value $V_{EV1}<0V$. If any storage elements fail to verify, they can either be logically remapped or subjected to further erasing, as show by the NO loop.

In one exemplary embodiment, the result post-erasure population will not necessarily correspond to the "0" or ground state. This is shown in FIG. 5 as the population 501. The result of the erase process generally results in a population with more spread than is desired, both because it results in a less well defined state and also because it represents a less uniform starting point from which to program the memory cells to higher states. Consequently, this exemplary embodiment also includes a soft-programming made up of steps 411, 413, or 415.

In a soft-programming process, the storage elements are gradually raised from their initial, post-erasure distribution 501 to the ground or "0" state 503. In the exemplary flash memory embodiment, this typically consists of a programming pulse (step 411), often using lesser voltages than in regular programming, whose result is then verified with a reference parameter (here a voltage $V_{EV2}$ in step 413). This continues until a certain number of cells, which can be a settable parameter, exceed the verify level $V_{EV2}$ (step 415). In a variation, the soft-programming process can also include the lockout from further programming of cells that verify correctly, as is discussed in U.S. patent application Ser. No. 10/068,245, filed Feb. 6, 2002, entitled "Implementation of an inhibit during soft programming to tighten an erase VT distribution" by Peng Pan and Tat-Kwan Edgar Yu, which is hereby incorporated by reference.

Since in some embodiments the soft-programming may continue until a number of storage elements' threshold exceed $V_{EV2}$, the fastest programming elements in the "0" population 503 will extend the top end population beyond this level. To insure that it does not extend too high, an additional verify level $V_{autoEV}$ can be used to check this in step 417. At this point the status of the device can be reported out and the wiring of data in step 419 taking the states not to remain in the "0" state to their target values.

The process of FIG. 4 is again just an exemplary embodiment and, even for a flash memory embodiment, there are many variations. For example, some of the verifies may be omitted. In particular, it is usually found that a memory behaves well enough so that the extra verify of step 417 is not required.

Returning to FIG. 5, 501 is the post-erasure distribution and 503 is the same set of storage elements after soft-programming. At this point, distribution 503 contains not just those cells whose target state is "0", but also those cells that will subsequently be programmed into the higher data states, such as the "1" distribution shown at 505. It is the various verify voltages ($V_{EV1}$, $V_{EV2}$, $V_{autoEV}$) of FIGS. 4 and 5 need to fit below 0V in the prior art. As with VR1 and the other reference voltages above 0V, less space is available for the negative reference values of these erase verify voltages as the voltage window shrinks.

A number of techniques are known for reading non-negative threshold voltage levels. For example, a bit line can be pre-changed and a voltage level applied to a cell's control gate and determining whether the bit line discharges, a process described in more detail in U.S. Pat. No. 6,317,363 that is hereby incorporated by reference. In the example of a NAND type memory, the bit line would be pre-charged from the source side of the NAND chain, the non-selected storage elements would have applied an over-drive voltage applied so that they are fully turned on, and the selected cell would have a control gate voltage appropriate to the threshold level to be measured. Such a technique will not work for a determining a cell's threshold voltage having a negative value, such as those related to the various erase verify levels described herein. One technique for determining negative threshold values, again described in the context of a NAND architecture, is to apply a voltage (such as $V_{dd}$) to the source side of the NAND chain, with the non-selected storage elements again turned fully on. A voltage level can then be applied to the selected cell's control gate such that if the threshold voltage is low enough, the cell will conduct due to the body bias.

Tables 1 and 2 present exemplary values for a control gate voltage ($V_{CG}$) and the threshold value of the highest cell in the result population that would verify at this value. They also present a read value for the lowest positive threshold value, VR1. The values of Table 1 corresponds to 3 volt design, such as is described in the Background section, while those of Table 2 correspond to the 1.8 volt design of the exemplary embodiment. In both of these tables, it should be noted that the "Highest Cell $V_{th}$" values of the storage cells are estimates.

TABLE 1

|  | $V_{CG}$ | Highest Cell $V_{th}$ |
|---|---|---|
| $V_{EV1}$ | 0 V | −0.8 V |
| $V_{EV2}$ | 0.45 V | −0.5 V |
| $V_{autoEV}$ | 0.65 V | −0.3 V |
| VR1 | 0 V | 0 V |

As shown in Table 1, the prior art reads the "1" state with a control gate voltage 0 Volts by connecting it to ground, resulting in the VR1 shown in FIG. 2. A design with Vdd=2.6V allows for an erase voltage to take the storage elements below a value if $V_{EV1}$<−0.8V for the post-erasure population 501. This allows a 0.8 volt window between $V_{EV1}$ and VR1 into which the $V_{EV2}$ and $V_{autoEV}$ be fit, here respectively at −0.5V and −0.3V. These threshold values correspond to placing Vdd on the drain of the cell and $V_{CG}$ on the control gate and using the body bias of the cell.

For a 1.8 volt design, the post-erasure population 501 is not moved as far into the negative voltage region. In particular, the exemplary embodiment again uses $V_{CG}$=0V for the initial erase verify, but now the highest cells in the distribution will be only about half a volt below ground, $V_{EV1}$=−0.5V. Consequently, this allows a widow of only half a volt into which to soft program the post erasure population and form the "0" state (503, FIG. 5) if the hardwiring of VR1 to ground is maintained. This is shown in Table 2 that gives also gives an exemplary value for $V_{EV2}$ and the optional $V_{autoEV}$, where the same $V_{CG}$ are used as in Table 1, but the verify levels now fit into the smaller available voltage widow.

TABLE 2

|  | $V_{CG}$ | Highest Cell $V_{th}$ |
|---|---|---|
| $V_{EV1}$ | 0 V | −0.5 V |
| $V_{EV2}$ | 0.45 V | −0.25 |
| $V_{autoEV}$ | 0.65 V | −0.05 V |
| VR1(T) | 0 V-0.2 V | 0 V-0.2 V |

Table 2 also shows a range of values of VR1 due to temperature compensation in the exemplary embodiment. As described previously, by compensating the read parameter, verify parameter, or both for the "1" state, the present invention only requires that the total space between the "0" and the "1" distribution (301 of FIG. 3) as these shift according to operating conditions is sufficiently large to insure data fidelity. In contrast, the prior art required that both the space between both the bottom of the "1" and the top of the "0" distribution and the fixed VR1=0V value (201 and 203, respectively, FIG. 2) is sufficiently large to insure data fidelity, independently of each other and independently of shifts in the distributions due to operation conditions. As the values of Table 2 show, the allowable space within the voltage window allows very little to be budgeted to insuring the "0" population could stay below a fixed VR1=0V value.

Referring to FIG. 6, a block diagram of an example memory system 10 incorporating aspects of the present invention is shown. Memory system 10 includes a large number of individually addressable memory cells arranged in a regular array 11 of rows and columns, although other physical arrangements of cells are possible. Bit lines (not shown in FIG. 6) extend along columns of array 11 and are connected to a bit line decoder and driver circuit 13 through lines 15. In exemplary embodiment, the memory cell array can be of the NAND or NOR type described in the references incorporated by reference above. Word lines (again not shown in FIG. 6) extend along rows of array 11 and are connected through lines 17 to a word line decoder and driver circuit 19. Steering gate lines (also not shown in FIG. 6) may extend along columns of array 11 and are connected to a steering gate decoder and driver circuit 21 through lines 23.

Each of the decoders 13, 19 and 21 receives memory cell addresses over a bus 25 from a memory controller 27. The decoder and driver circuits are also connected to controller 27 over respective control and status signal lines 29, 31 and 33. Voltages applied to the steering gates and bit lines are coordinated through a bus 22 that interconnects the decoder and driver circuits 13 and 21.

Controller 27 is connectable through lines 35 to a host device (not shown). The host may be, for example, a personal computer, notebook computer, digital camera, audio player, or any of various other hand-held electronic devices. The memory system of FIG. 6 will commonly be implemented in a card according to one of several existing physical and electrical standards, such as the standards set by the PCMCIA, the CompactFlash™ Association, the MMC™ Association or the Secure Digital (SD) Card Association. When in a card format, the lines 35 terminate in a connector on the card which interfaces with a complementary connector of the host device. The electrical interface of many cards follows the ATA standard, wherein the memory system appears to the host as if it were a magnetic disk drive. Other memory card interface standards also exist. Alternatively to the card format, memory systems of the type shown in FIG. 6 are embedded in the host device.

FIG. 6 also shows reference voltage generator 47. As noted above, compensation for operating conditions around 0 volts can not be readily implemented by traditional methods, such as a band gap generator. Another technique used for compensation is a resistor divider; however, aside from the disadvantage of being a current sink, such a divider may not be stable at low voltage levels and is again not suitable for use near $V_{CG}$=~0V.

In one exemplary embodiment, the reference voltage generator 47 can include a band gap generator connected to a negative voltage source, which would produce a negative voltage level from the power supply, thereby allowing the band gap generator to supply the needed VR1 values near 0 volts. (Details on band gap generators are described, for example, in "Analog Integrated Circuit Design", David A. Johns and Ken Martin, John Wiley & Sons, 1997, which is hereby incorporated by this reference.) Although FIG. 6 schematically shows the reference voltage generator 47 on the same memory device as the memory array, either one or both of the band gap generator or the negative voltage generator can be on another chip in the memory system from which the voltage levels would then be supplied.

Although the various aspects of the present invention have been described with respect to specific embodiments; it will be understood that the invention is protected within the full scope of the appended claims.

It is claimed:

1. A memory comprising:
a non-volatile data storage element capable of storing a first data state characterized by a negative threshold voltage and one or more second data states characterized by a positive threshold voltage; and
sense circuitry connectable to the data storage element that can distinguish the data state of the storage element, comprising;
a compensation circuit, whereby a voltage applied to a control gate of the data storage element by the sense circuitry to distinguish between the first and second data states in a normal read process is varied as a continuous function of one or more operating conditions.

2. The memory of claim 1, wherein said operating conditions comprise temperature.

3. The memory of claim 1, wherein said operating conditions comprise the voltage level of an external power supply.

4. The memory of claim 1, wherein said data storage element is capable of storing a plurality of said second data states.

5. The memory of claim 1, wherein said voltage applied to the control gate of the data storage element is in a range of from 0 volts to 0.2 volts.

6. The memory of claim 1, further comprising:
write circuitry connectable to the data storage element and the sense circuitry, wherein the sense circuitry is used for program verify and the verify level for the second data states is compensated based on operating conditions.

7. The memory of claim 1 further comprising:
a negative voltage source; and
a band gap generator connectable to the negative voltage source whereby said voltage applied to the control gate of the data storage element is provided.

8. The memory of claim 7 wherein said band gap generator provides a voltage in the range of 0 volts to 0.2 volts.

9. A method of operating a non-volatile memory, comprising:
selecting a data storage element storing one of a plurality of data states, said plurality of data states comprising a first data state characterized by a negative threshold voltage and one or more second data states characterized by a positive threshold voltage; providing a control gate voltage, wherein said control gate voltage is varied as a continuous function of one or more operating conditions; and
applying said control gate voltage to the selected data storage element to distinguish in a normal read process between the first data states and the second data states.

10. The method of claim 9, wherein said plurality of data states comprises a plurality of second data states.

11. The method of claim 9, wherein said operating conditions comprise temperature.

12. The method of claim 9, wherein said operating conditions comprise the voltage level of an external power supply.

13. The method of claim 9, wherein said control gate voltage is in the range of 0 volts to 0.2 volts.

14. The method of claim 9, further comprising:
generating a negative voltage, wherein the control gate voltage is produced using said negative voltage.

* * * * *